(12) United States Patent
Kang et al.

(10) Patent No.: US 8,382,305 B2
(45) Date of Patent: Feb. 26, 2013

(54) BACKLIGHT UNIT AND DISPLAY DEVICE USING THE SAME

(75) Inventors: Jeung Mo Kang, Seoul (KR); Du Hyun Kim, Seoul (KR); Jae Wook Kim, Seoul (KR); Jeong Hyeon Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 203 days.

(21) Appl. No.: 12/896,409

(22) Filed: Oct. 1, 2010

(65) Prior Publication Data

US 2011/0164402 A1 Jul. 7, 2011

(30) Foreign Application Priority Data

Jan. 6, 2010 (KR) .......................... 10-2010-000077

(51) Int. Cl.
*G09F 13/04* (2006.01)
(52) U.S. Cl. ................... 362/97.1; 362/249.02
(58) Field of Classification Search ........ 362/97.1–97.4, 362/249.01, 249.02, 311.02
See application file for complete search history.

(56) References Cited

U.S. PATENT DOCUMENTS

| | | | | |
|---|---|---|---|---|
| 4,714,983 | A * | 12/1987 | Lang ............................... | 362/27 |
| 6,255,129 | B1 * | 7/2001 | Lin ................................ | 438/26 |
| 6,637,905 | B1 * | 10/2003 | Ng et al. ........................ | 362/601 |
| 7,196,459 | B2 * | 3/2007 | Morris ........................... | 313/46 |
| 7,218,824 | B2 * | 5/2007 | Franklin et al. ............... | 385/125 |
| 2002/0131261 | A1 * | 9/2002 | Inui et al. ....................... | 362/31 |
| 2005/0045897 | A1 | 3/2005 | Chou et al. | |
| 2006/0104080 | A1 * | 5/2006 | Kim et al. ..................... | 362/555 |
| 2006/0187651 | A1 | 8/2006 | Kim et al. | |
| 2006/0203513 | A1 | 9/2006 | Aoki | |
| 2006/0268567 | A1 | 11/2006 | Jang et al. | |
| 2007/0086179 | A1 * | 4/2007 | Chen et al. .................... | 362/27 |
| 2007/0121340 | A1 * | 5/2007 | Hoshi ............................ | 362/600 |
| 2008/0137333 | A1 | 6/2008 | Tamaoki et al. | |
| 2009/0061552 | A1 | 3/2009 | Chang | |
| 2009/0135330 | A1 * | 5/2009 | Kawase et al. ................ | 349/58 |
| 2009/0147513 | A1 | 6/2009 | Kolodin et al. | |
| 2009/0180282 | A1 | 7/2009 | Aylward et al. | |
| 2009/0185107 | A1 | 7/2009 | Panagotacos et al. | |
| 2010/0021431 | A1 | 1/2010 | Nakamura et al. | |
| 2010/0213488 | A1 * | 8/2010 | Choi et al. ..................... | 257/98 |
| 2010/0238648 | A1 | 9/2010 | Tsukahara | |

FOREIGN PATENT DOCUMENTS

| | | |
|---|---|---|
| JP | 2004-214208 A | 7/2004 |
| JP | 2006-93602 A | 4/2006 |
| JP | 2006-227423 A | 8/2006 |
| JP | 2006-339151 A | 12/2006 |
| JP | 2007-165064 A | 6/2007 |
| JP | 2007-227286 A | 9/2007 |
| JP | 2008-123969 A | 5/2008 |
| JP | 2009-140829 A | 6/2009 |
| KR | 10-2006-0031518 A | 4/2006 |
| KR | 10-2009-0032620 A | 4/2009 |
| KR | 10-2009-0059877 A | 6/2009 |
| KR | 10-2009-0073452 A | 7/2009 |
| WO | WO 2009/040722 A2 | 4/2009 |

* cited by examiner

*Primary Examiner* — Julie Shallenberger

(74) *Attorney, Agent, or Firm* — Birch, Stewart, Kolasch & Birch, LLP

(57) ABSTRACT

A backlight unit includes a bottom cover; a light emitting module on the bottom cover and including a substrate and a plurality of light emitting devices, each light emitting device including a light emitting structure having a first conductive semiconductor layer, an active layer and a second conductive semiconductor layer; and a light guide member on the light emitting module and including at least one insertion cavity into which at least one of the plurality of light emitting devices is inserted, wherein the at least one insertion cavity is opened only on one side.

23 Claims, 5 Drawing Sheets

BACKLIGHT UNIT AND DISPLAY DEVICE USING THE SAME

This application claims priority under 35 U.S.C. §119(a) of Korean Patent Application No. 10-2010-0000777 filed on Jan. 6, 2010, which is hereby incorporated by reference in its entirety.

BACKGROUND OF THE INVENTION

1. Field of the Invention

Embodiments of the invention relate to a backlight unit.

2. Discussion of the Related Art

Recently, an LCD (a liquid crystal display) has been spotlighted as a substitute for a CRT (a cathode ray tube) display because of advantages of small size, light weight and low power consumption. The LCD is extensively employed in various information processing devices equipped with display devices.

Since the LCD is a non-emissive display device, an additional light source, such as a backlight unit, is necessary. In addition, various studies and research have been performed to provide an image having a high quality by effectively using light emitted from the backlight unit.

SUMMARY OF THE INVENTION

Embodiments of the invention provide a backlight unit having a novel structure and a display device using the same.

The embodiments of the invention provide a backlight unit having a reduced thickness and a display device using the same.

The embodiments of the invention provide a backlight unit having superior color mixture property and light uniformity, and a display device using the same.

According to an embodiment, a backlight unit includes a bottom cover; a light emitting module on the bottom cover and including a substrate and a plurality of light emitting devices, each light emitting device including a light emitting structure having a first conductive semiconductor layer, an active layer and a second conductive semiconductor layer; and a light guide member on the light emitting module and including at least one insertion cavity into which at least one of the plurality of light emitting devices is inserted, wherein the at least one insertion cavity is opened only on one side.

According to another embodiment, a backlight unit includes a bottom cover; a light emitting module on the bottom cover and including a substrate and a plurality of light emitting devices, each light emitting device including a light emitting structure having a first conductive semiconductor layer, an active layer and a second conductive semiconductor layer; and a molding member including a transmittive material to cover the plurality of light emitting devices.

According to another embodiment, a display device includes a backlight unit including: a bottom cover, a light emitting module on the bottom cover, the light emitting module including a substrate and a plurality of light emitting devices, wherein each light emitting device includes a light emitting structure having a first conductive semiconductor layer, an active layer and a second conductive semiconductor layer, and a light guide member on the light emitting module and including at least one insertion cavity into which at least one of the plurality of light emitting devices is inserted, wherein the at least one insertion cavity is opened only on one side; and a display panel over the backlight unit.

DETAILED DESCRIPTION OF THE EMBODIMENTS

Figure 1:
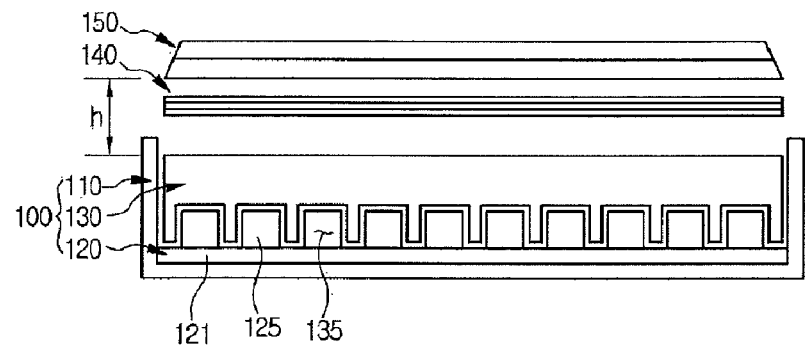
FIG. 1 is a sectional view showing a backlight unit and a display device using the same according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not reflect an actual size.

Hereinafter, a backlight unit and a display device using the same according to the embodiments will be described in detail with reference to accompanying drawings.

<First Embodiment>

Figure 2:
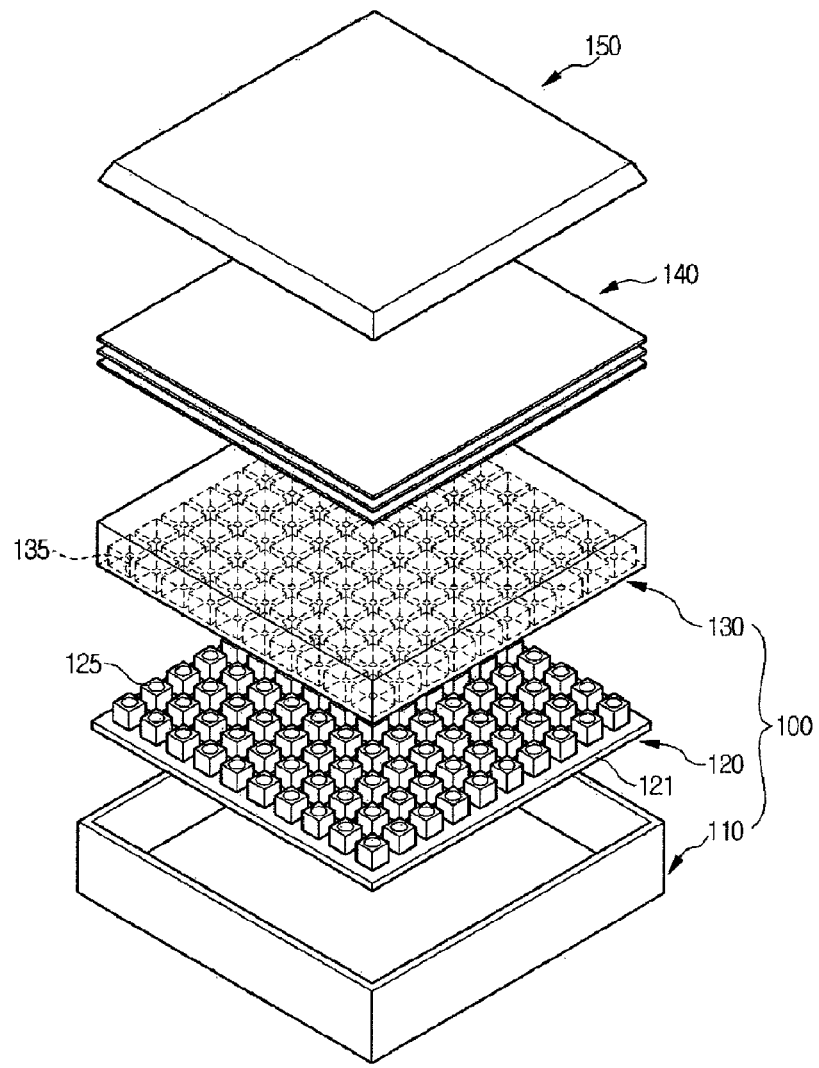
FIG. 2 is an exploded perspective view showing a backlight unit and a display device using the same shown in FIG. 1.

FIG. 1 is a sectional view showing a backlight unit 100 and a display device using the same according to a first embodiment, and FIG. 2 is an exploded perspective view showing the backlight unit 100 and the display device using the same.

Referring to FIGS. 1 and 2, the display device includes a display panel 150 for displaying an image and the backlight unit 100 for supplying light to the display panel 150.

In addition, the backlight unit 100 may include a bottom cover 110, a light emitting module 120 installed in the bottom cover 110 and having a substrate 121 and a plurality of light emitting devices 125 disposed on the substrate 121, and a light guide member 130 disposed on the light emitting module 120 and having a plurality of insertion grooves (or insertion cavities) 135 into which the light emitting devices 125 are inserted.

According to the embodiment, the light emitting devices 125 are inserted into the insertion grooves 135 to supply light to the light guide member 130. The light supplied to the light guide member 130 is converted into surface light having superior color mixture property and uniformity by the light guide member 130, and then supplied to the display panel 150 disposed above the backlight unit 100.

Since the light emitting devices 125 are inserted into the insertion grooves 135 of the light guide member 130, the thickness of the backlight unit 100 and the display device using the backlight unit 100 can be reduced. To receive the light emitting devices 125, the insertion groove 135 is opened only on one side.

In addition, the backlight unit 100 having the above structure presents the superior color mixture property and light uniformity, so that a distance between the backlight unit 100 and the display panel 150 can be reduced, thereby further reducing the thickness of the display device. For instance, in the display device according to the embodiment, the distance h between the substrate 121 of the backlight unit 100 and the display panel 150 may be in the range of about 10 mm to 30 mm.

Hereinafter, the elements of the backlight unit 100 according to the first embodiment will be described in detail.

The bottom cover 110 may have a box shape with a top surface being open to receive the light emitting module 120 and the light guide member 130 therein, but the embodiment is not limited thereto. The bottom cover 110 may be fabricated through the pressing or extruding process by using metal or resin.

The light emitting module 120 may be disposed in the bottom cover 110. The light emitting module 120 may include the substrate 121 and the light emitting devices 125 disposed on the substrate 121. The light emitting devices 125 are disposed below the light guide member 130 to directly supply the light to the light guide member 130.

The substrate may include one of a printed circuit board (PCB), a metal core PCB, a flexible PCB and a ceramic substrate, but the embodiment is not limited thereto.

A reflective sheet may be disposed on the substrate 121 to expose the light emitting devices 125 while covering the substrate. In addition, the top surface of the substrate 121 may be coated with reflective material to prevent the light emitted from the light emitting devices 125 from being absorbed in the substrate 121.

The light emitting devices 125 are mounted on one surface of the substrate 121 in the form of an array having a row and a column. For instance, the light emitting device 125 includes a light emitting diode (LED). The LED may be at least one of a color LED that emits red, green, blue or white light and an ultraviolet (UV) LED that emits UV light. The embodiment may not be limited to a particular number, arrangement and color of the light emitting devices 125.

Figure 3:
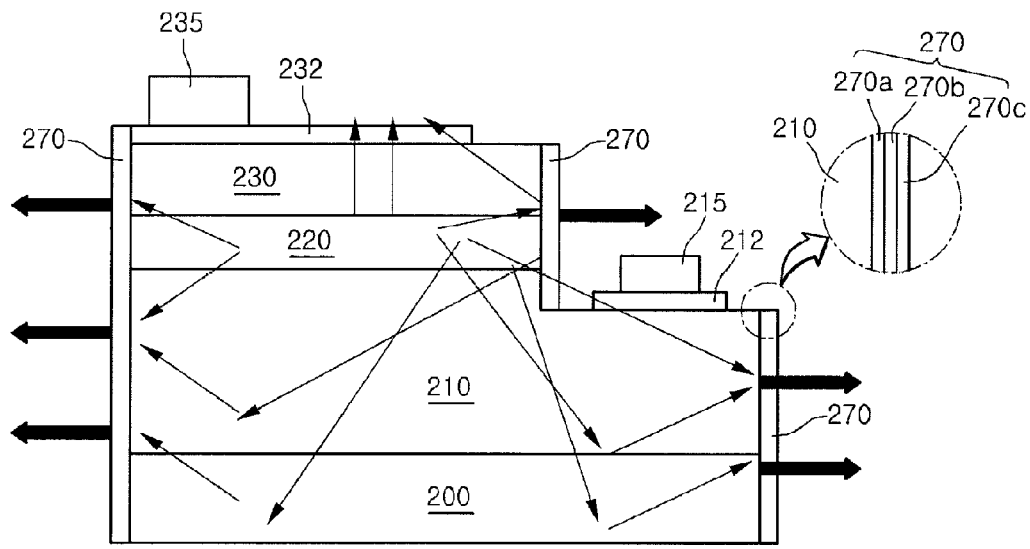
FIG. 3 is a sectional view showing a light emitting device mounted in a backlight unit.

FIG. 3 is a sectional view showing the light emitting device installed in the backlight unit 110. The light emitting device 125 can be formed at a lateral side thereof with a non-reflective layer to improve light emitting efficiency in the lateral direction. That is, the light emitting device 125 may include a first conductive semiconductor layer, an active layer and a second conductive semiconductor layer, which are sequentially formed on a substrate, and a non-reflective region formed at lateral sides of the active layer and the second conductive semiconductor layer, so that the light emitted from the active layer or the light reflected or refracted from the substrate or a GaN semiconductor layer can be effectively emitted to the outside from the lateral side of the light emitting device 125, thereby improving the light extraction efficiency in the lateral direction of the light emitting device 125.

Hereinafter, a method of manufacturing the light emitting device will be described with reference to FIG. 3. First, a first substrate 200 is prepared. The first substrate 200 may include a sapphire single crystalline substrate, but the embodiment is not limited thereto. A wet cleaning process is performed on the first substrate 200 to remove impurities from the surface of the first substrate 200.

Then, the first conductive semiconductor layer 210 is formed on the first substrate 200. For instance, the first conductive semiconductor layer 210 is formed through chemical vapor deposition (CVD), molecular beam epitaxy (MBE), sputtering, or hydride vapor phase epitaxy (HVPE) scheme. In addition, the first conductive semiconductor layer 210 can be formed by injecting silane gas $SiH_4$ including n type impurities, such as TMGa, $NH_3$, $N_2$, $H_2$, or Si, into the chamber.

Then, the active layer 220 is formed on the first conductive semiconductor layer 210. Electrons injected through the first conductive semiconductor layer 210 meet holes injected through the second conductive semiconductor layer 230 at the active layer 220, so that the active layer 220 emits the light having energy determined according to energy band of intrinsic material of the active layer 220.

The active layer 220 may have a single quantum well structure, a multiple quantum well (MQW) structure, a quantum wire structure or a quantum dot structure by stacking nitride semiconductor layers having different energy bands at least one time. For instance, the active layer 220 may have a multiple quantum well structure of InGaN/GaN by injecting TMGa, $NH_3$, $N_2$, TMIn into the chamber, but the embodiment is not limited thereto.

Then, the second conductive semiconductor layer 230 is formed on the active layer 220. For instance, the second conductive semiconductor layer 230 can be formed by injecting $(EtCp_2Mg)\{Mg(C_2H_5C_5H_4)_2\}$ including p type impurities, such as TMGa, $NH_3$, $N_2$, $H_2$ and Mg, into the chamber, but the embodiment is not limited thereto.

Then, the second conductive semiconductor layer 230, the active layer 220 and the first conductive semiconductor layer 210 are partially removed to expose the first conductive semiconductor layer 210. For instance, after forming a pattern mask, the second conductive semiconductor layer 230, the active layer 220 and the first conductive semiconductor layer 210 are partially etched by using the pattern mask as an etching mask, thereby exposing the first conductive semiconductor layer 210. The pattern mask may include silicon nitride, silicon oxide or a photoresist layer.

After that, the pattern mask is removed, and a first electrode 215 is formed on the exposed first conductive semiconductor layer 210. Then, a second electrode 235 is formed on the second conductive semiconductor layer 230. Then, a non-reflective layer 270 is formed at lateral sides of the first substrate 200, the first conductive semiconductor layer 210, the active layer 220, and the second conductive semiconductor layer 230.

The non-reflective layer 270 can be deposited in the form of a thin film through an E-beam evaporation scheme or a sputtering scheme. In order to obtain the desired reflectance-wavelength curve, materials having desired refractive indexes may be repeatedly deposited such that the light extraction efficiency can be improved in the lateral direction.

Since the non-reflective layer 270 include at least two layers having different refractive indexes, it is possible to induce destructive interference of wavelengths of light reflected from a boundary of each layer. Two conditions are required for the destructive interference. That is, the reflected lights must have phase differences and the destructive lights must have predetermined amplitudes to minimize the reflectance during the destructive interference.

In order to reduce the reflectance, the optical thickness must satisfy an odd multiple of $\lambda/4$, that is, the optical thickness can be set to $\lambda/4$.

Main factors for the non-reflective layer 270 may include a refractive index of high-reflective or low-reflective material, a number of layers, and a thickness of each layer. The reflectance is reduced as the difference in refractive index between two layers is increased. In addition, a pattern of the reflective wavelength is shifted according to the thickness of the layer and the reflectance is constantly reduced over the whole wavelength band of visible ray as the number of the layers is increased.

For instance, in order to obtain low reflectance in the region having a relatively large wavelength band, the non-reflective layer may have a stacked structure including at least two layers.

In detail, the non-reflective layer 270 can be obtained by forming a first refractive layer 270a having a first refractive index and forming a second refractive layer 270c having a second refractive index higher than the first refractive index.

That is, the non-reflective layer 270 includes a low refractive layer and a high refractive layer having a thickness of $\lambda/4$, respectively, and presents a V-shaped reflective pattern which can minimize reflectance at a specific wavelength band. When compared with the single-layer non-reflective layer, the average reflectance of the non-reflective layer 270 is lower by about 1% in the visible band of light.

In addition, the non-reflective layer 270 may have three layers. That is, a third refractive layer 270b having a third refractive index higher than the second refractive index can be formed on the first refractive layer 270a. In this case, the second refractive layer 270c is formed on the third refractive layer 270b. For instance, the non-reflective layer 270 may include a low refractive layer having a thickness of $\lambda/4$, an ultra-high refractive layer having a thickness of $\lambda/2$, and a high refractive layer having a thickness of $\lambda/4$. Due to the destructive interference between layers, a W-shaped reflective pattern is presented. Very low average reflectance less than 1% is presented over the whole wavelength band of the visible ray and the non-reflective layer 270 represents a weak reflective color.

The first refractive layer 270a serving as the low refractive layer may employ a medium having the refractive index of about 1.3 to 1.5, the third refractive layer 270b serving as the ultra-high refractive layer may employ a medium having the refractive index of about 2.0 to 2.5, and the second refractive layer 270c serving as the high refractive layer may employ a medium having the refractive index of about 1.6 to 1.8.

Dielectric substance having the high refractive index may include $TiO_2$ or $ZrO_2$, and dielectric substance having the low refractive index may include $SiO_2$, but the embodiment is not limited thereto. Various materials can be employed if they have the above described refractive index.

The non-reflective layer 270 can be formed through the E-beam evaporation scheme or the sputtering scheme. The roughness can be formed at the lateral sides of the light emitting device in place of the non-reflective layer 270, and the non-reflective layer 270 can be adopted in the vertical type light emitting device as well as the lateral type light emitting device.

Figure 4:
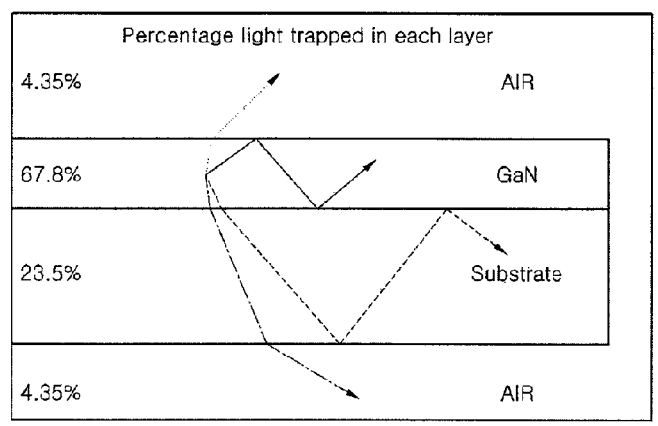
FIG. 4 is a view showing percentages of light trapped in each layer in a light emitting device.

FIG. 4 is a view showing percentages of light trapped in each layer in the light emitting device.

FIG. 4 shows the extraction degree of light, which is emitted from the LED, to the outside. In general, GaN has a relatively higher refractive index, so most light remains in the GaN and the substrate and only some of light is emitted to the outside. Similarly, in the LED, a GaN layer and a substrate have relatively higher refractive indexes so the light is rarely emitted in the lateral direction. However, since the non-reflective layer or the fine roughness is formed at the lateral sides of the LED, the light can be effectively emitted in the lateral direction, so the LED can be effectively used in the backlight unit.

Meanwhile, a thermal conductive pad can be disposed between the light emitting module 120 and the bottom cover 110. The thermal conductive pad effectively transfers heat generated from the light emitting module 120 to the bottom cover 110, thereby improving heat dissipation characteristic of the light emitting module 120.

The light guide member 130 can be disposed on the light emitting module 120. For instance, the light guide member 130 includes a light guide plate. The light guide member 130 can be fabricated by using transmittive material including at least one of acryl-based resin, such as PMMA(polymethyl methacrylate), PET(polyethylene terephthalate), PC(polycarbonate), COC and PEN(polyethylene naphthalate) resin.

The light guide member 130 is formed at the bottom surface thereof with insertion grooves 135 into which the light emitting devices 125 are inserted.

The insertion groove 135 may have a sectional shape including one of a polygonal column, a cylinder, a hemisphere, a cone, a polygonal cone, a truncated cone, and a truncated polygonal cone, but the embodiment is not limited thereto.

The insertion grooves 135 may be formed on the bottom surface of the light guide member 130 in the form of a matrix corresponding to the arrangement of the light emitting devices 125.

The width and depth of each insertion groove 135 may be up to twice the width and thickness of the light emitting device 125. If the insertion groove 135 has a width and depth, which is more than twice the width and thickness of the light emitting device 125, light loss may occur when the light is incident into the light guide member 130 from the light emitting device 125. In an embodiment, for each insertion groove 135, there may be a plurality of light emitting devices.

Figure 5:
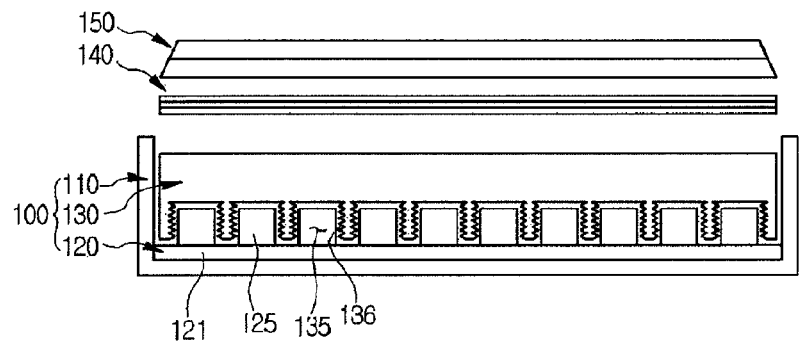
FIGS. 5 to 7 are sectional views showing various insertion grooves formed in a light guide member of a backlight unit according to the first embodiment.
Figure 6:
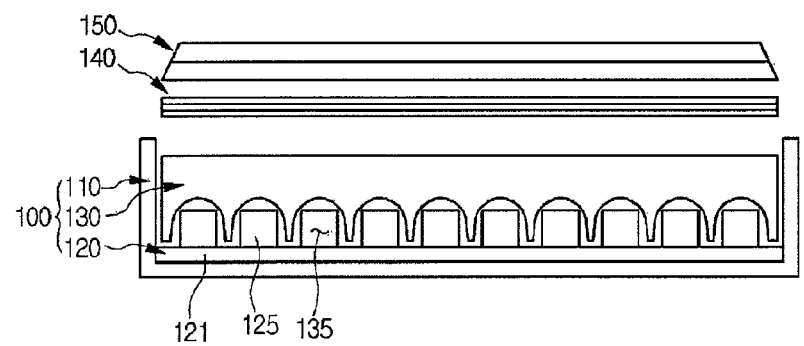
Figure 7:
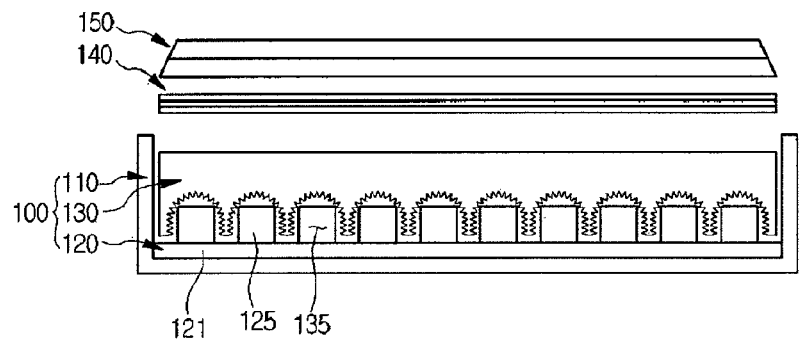

The insertion groove 135 may have various sectional shapes to minimize loss of the incident light. FIGS. 5 to 7 are sectional views showing various insertion grooves formed in the light guide member 130 of the backlight unit according to the first embodiment.

Referring to FIG. 5, a roughness structure can be formed at an inner wall of each insertion groove 135 of the light guide member 130. Due to the roughness structure, the light emitted from the light emitting device 125 in the lateral direction can be effectively introduced into the light guide member 130, so that the light uniformity and color mixture property of the light guide member 130 can be improved.

Referring to FIG. 6, the insertion groove 135 of the light guide member 130 may have a hemispheric shape. In this instance, there is some play or space between the light emitting device 125 and the inner wall of the insertion groove 135 or portions thereof. Referring to FIG. 7, a roughness structure is formed at an inner wall of the insertion groove 135 having the hemispheric shape of the light guide member 130. Due to the hemispheric shape and the roughness structure, the light can be effectively introduced into the light guide member 130.

That is, the insertion grooves 135 can be appropriately selected according to the type and light distribution characteristic of the light emitting devices 125 and the size of the insertion grooves 135, but the embodiment is not limited thereto.

Figure 8:
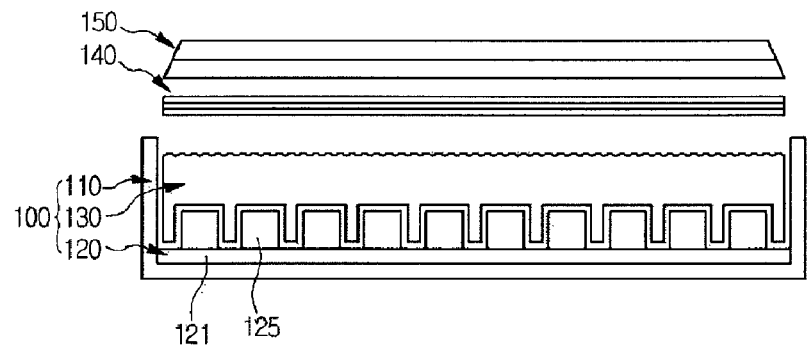
FIG. 8 is a sectional view showing another light guide member of a backlight unit according to the first embodiment.

Meanwhile, as shown in FIG. 8, the roughness structure can be formed on the top surface of the light guide member 130. Due to the roughness structure, the light, which is introduced into the light guide member 130 and converted into surface light, can be effectively extracted onto the top surface of the light guide member 130.

The thickness of the light guide member 130 is thicker than the thickness of each light emitting device 125. For instance, the light guide member 130 may have the thickness of 1 mm to 10 mm, preferably, 3 mm to 10 mm. In order to allow the light introduced into the light guide member 130 to be diffused to have uniformity and good color mixture property, the light guide member 130 has the thickness of about 3 mm or above. The bottom cover 110, the light emitting module 120 and the light guide member 130 may constitute the backlight unit 100.

Meanwhile, the display device according to the embodiment includes the display panel 150 displaying an image, and the backlight unit 100 supplying the light to the display panel 150. Hereinafter, the display device according to the embodiment will be described in detail.

The display panel 150 is disposed above the backlight unit 100. The display panel 150 displays the image by using the light supplied from the backlight unit 100. The display panel 150 can be supported by a panel support and a top cover.

The display panel 150 may include lower and upper substrates, which are combined to face each other such that a uniform cell gap can be formed therebetween, and a liquid crystal layer interposed between the two substrates. A plurality of gate lines and data lines crossing the gate lines are formed on the lower substrate and a thin film transistor is formed on a cross region between the gate line and the data line. Color filters are formed on the upper substrate. The display panel 150 may have various structures. For instance, the lower substrate may include the color filter as well as the thin film transistor. In addition, the display panel 150 may have various structures according to the driving scheme for the liquid crystal layer.

In addition, a gate driving PCB, which supplies a scan signal to the gate line, and a data driving PCB, which supplies a data signal to the data line, can be provided at an outer peripheral portion of the display panel 150.

An optical sheet unit 140 is disposed between the backlight unit 100 and the display panel 150 to improve uniformity and color mixture property of the light supplied from the backlight unit 100. The optical sheet unit 140 may include at least one of a diffusion sheet, a light collection sheet and a brightness enhancement sheet.

For instance, the optical sheet unit 140 can be formed by sequentially stacking the diffusion sheet, the light collection sheet, and the brightness enhancement sheet. In this case, the diffusion sheet uniformly diffuses the light emitted from the light guide member 130 such that the diffused light can be collected on the display panel by the light collection sheet. The light output from the light collection sheet is randomly polarized and the brightness enhancement sheet increases the degree of polarization of the light output from the light collection sheet.

The light collection sheet may include a horizontal and/or vertical prism sheet. In addition, the brightness enhancement sheet may include a dual brightness enhancement film. The type and the number of the optical sheet unit 140 or components thereof may vary within the technical scope of the embodiment and the embodiment is not limited thereto.

As described above, the backlight unit 100 includes the light emitting devices 125 inserted into the insertion grooves 135 of the light guide member 130, so the backlight unit 100 may have superior color mixture property and the light uniformity. Thus, even if the distance h between the backlight unit 100 and the display panel 150 is reduced, a non-uniformity of optical mura/chrominance may not occur. For instance, the distance h between the substrate 121 of the backlight unit 100 and the display panel 150 may be in the range of about 10 mm to 30 mm.

<Second Embodiment>

Hereinafter, the backlight unit and the display device using the same according to a second embodiment will be described in detail. Description about the elements and structures that have already been explained in the first embodiment will be omitted or briefly explained in order to avoid redundancy.

Figure 9:
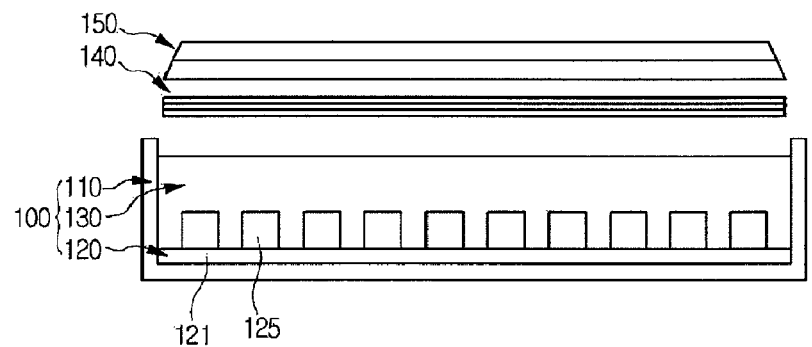
FIG. 9 is a sectional view showing a backlight unit and a display device using the same according to a second embodiment.

FIG. 9 is a sectional view showing the backlight unit and the display device using the same according to a second embodiment. Referring to FIG. 9, the backlight unit 100 according to the second embodiment may include the bottom cover 110, the light emitting module 120 installed in the bottom cover 110 and having a substrate 121 and a plurality of light emitting devices 125 formed on the substrate 121, and the light guide member 130 formed on the light emitting module 120 by using transmittive resin material to seal the light emitting devices 125.

The backlight unit 100 according to the second embodiment is similar to that of the first embodiment except for the material and shape of the light guide member 130. The light guide member 130 is formed on the light emitting module 120 to seal the light emitting devices 125. In detail, the light guide member 130 is formed on the substrate 121 of the light emitting module 120 and the light emitting devices 125, and an inner wall of the light guide member 130 makes contact with the light emitting devices 125. Thus, the light guide member 130 in this embodiment is a molding member.

The light guide member 130 may include transmittive resin material. For instance, the transmittive resin material includes epoxy resin or silicon resin, but the embodiment is not limited thereto. After coating the transmittive resin material on the light emitting module 120, the coated transmittive resin material is cured to form the light guide member 130.

The light emitting devices 125 are sealed and surrounded by the light guide member 130, so that the light emitted from the light emitting devices 125 can be effectively introduced into the light guide member 130. In addition, the light introduced into the light guide member 130 is effectively diffused in the light guide member 130, thereby improving the light uniformity and color mixture property.

Figure 10:
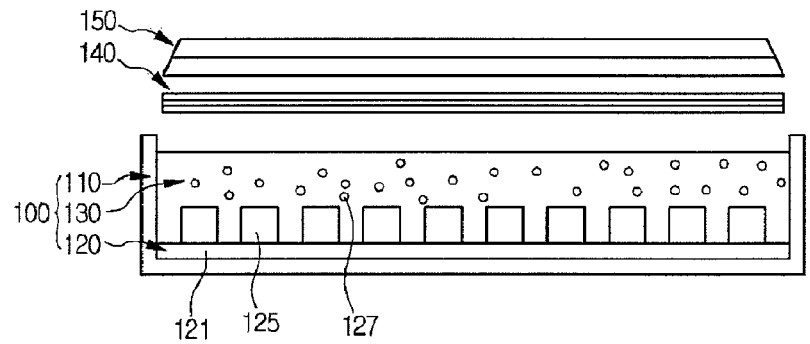
FIG. 10 is a sectional view showing another backlight unit according to the second embodiment.

Meanwhile, as shown in FIG. 10, a diffusing agent 127 may be provided in the light guide member 130. The diffusing agent 127 scatters the light introduced into the light guide member 130, thereby diffusing the light.

For instance, the diffusing agent 127 includes at least one of $SiO_2$, $TiO_2$, ZnO, $BaSO_4$, $CaSO_4$, $MgCO_3$, $(Al(OH)_3)$, synthetic silica, glass bead, and diamond, but the embodiment is not limited thereto.

<Third Embodiment>

Hereinafter, the backlight unit and the display device using the same according to a third embodiment will be described in detail . Description about the elements and structures that have already been explained in the first embodiment will be omitted or briefly explained in order to avoid redundancy.

Figure 11:
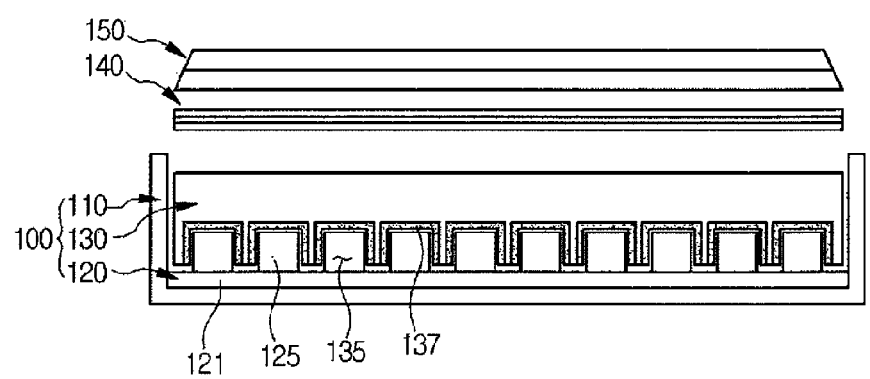
FIG. 11 is a sectional view showing a backlight unit and a display device using the same according to a third embodiment.

FIG. 11 is a sectional view showing the backlight unit and the display device using the same according to the third embodiment. Referring to FIG. 11, the backlight unit 100 according to the third embodiment may include the bottom cover 110, the light emitting module 120 installed in the bottom cover 110 and having a substrate 121 and a plurality of light emitting devices 125 formed on the substrate 121, the light guide member 130 formed on the light emitting module 120 and having a plurality of insertion grooves 135 into which the light emitting devices 125 are inserted, and a fluorescent layer 137 formed at an inner wall of the insertion grooves 135.

The backlight unit 100 according to the third embodiment is similar to that of the first embodiment except for the existence of a fluorescent layer 137. The fluorescent layer 137 is formed at the inner wall of the insertion grooves 135. The fluorescent layer 137 may include a transmittive resin, such as a silicon resin or an epoxy resin, and a phosphor included in the transmittive resin may be excited by the light emitted from the light emitting devices 125 to generate light.

Thus, the wavelength of the light emitted from the light emitting devices 125 is changed by the fluorescent layer 137 before the light is introduced into the light guide member 130. That is, the light introduced into the light guide member 130 may be a mixture of light including first light emitted from the light emitting devices 125 and second light generated from the phosphor excited by the first light.

The fluorescent layer 137 may have a roughness structure such as shown in FIG. 5, such that the light can be effectively introduced into the fluorescent layer 137.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A backlight unit, comprising:
    a bottom cover;
    a light emitting module on the bottom cover and including a substrate and a plurality of light emitting devices, each light emitting device including a light emitting structure having a first conductive semiconductor layer, an active layer and a second conductive semiconductor layer; and
    a light guide member on the light emitting module and including at least one insertion cavity into which at least one of the plurality of light emitting devices is inserted, wherein the at least one insertion cavity is opened only on one side,
    wherein the each light emitting device has a non-reflective layer disposed on a lateral side of the light emitting structure, and
    wherein the non-reflective layer comprises at least two layers having different refractive indices.

2. The backlight unit as claimed in claim 1, wherein the light guide member has a thickness of about 1 mm to 10 mm.

3. The backlight unit as claimed in claim 1, wherein a width and a depth of each insertion cavity are larger than a width and a thickness of each light emitting device by one to two times, respectively.

4. The backlight unit as claimed in claim 1, wherein the at least one insertion cavity has a sectional shape including one of a polygonal column, a cylinder, a hemisphere, a cone, a polygonal cone, a truncated cone, and a truncated polygonal cone.

5. The backlight unit as claimed in claim 1, wherein the at least one insertion cavity is formed on an inner wall thereof with a roughness structure.

6. The backlight unit as claimed in claim 1, wherein the at least one insertion cavity is formed on an inner wall thereof with a fluorescent layer.

7. The backlight unit as claimed in claim 1, wherein the light guide member includes a light guide plate.

8. The backlight unit as claimed in claim 1, wherein the light guide member is formed on a top surface thereof with a roughness structure.

9. The backlight unit as claimed in claim 1, wherein the substrate is formed on a top surface thereof with a reflective material.

10. The backlight unit as claimed in claim 1, wherein the each light emitting device includes at least one of a color LED that emits red, green, blue or white light and an ultraviolet (UV) LED that emits UV light.

11. A backlight unit, comprising:
    a bottom cover;
    a light emitting module on the bottom cover and including a substrate and a plurality of light emitting devices, each light emitting device including a light emitting structure having a first conductive semiconductor layer, an active layer and a second conductive semiconductor layer; and
    a molding member including a transmittive material to cover the plurality of light emitting devices,
    wherein the each light emitting device has a non-reflective layer disposed on a lateral side of the light emitting structure, and
    wherein the non-reflective layer comprises at least two layers having different refractive indices.

12. The backlight unit as claimed in claim 11, wherein the molding member is a light guide member.

13. The backlight unit as claimed in claim 11, wherein the transmittive material includes one of an epoxy resin and a silicon resin.

14. The backlight unit as claimed in claim 11, wherein an inner surface of the molding member makes contact with the plurality of light emitting devices.

15. The backlight unit as claimed in claim 11, further comprising a diffusing agent in the molding member.

16. A display device, comprising:
    a backlight unit including:
        a bottom cover,
        a light emitting module on the bottom cover, the light emitting module including a substrate and a plurality of light emitting devices, wherein each light emitting device includes a light emitting structure having a first conductive semiconductor layer, an active layer and a second conductive semiconductor layer, and
        a light guide member on the light emitting module and including at least one insertion cavity into which at least one of the plurality of light emitting devices is inserted, wherein the at least one insertion cavity is opened only on one side; and
    a display panel over the backlight unit,
    wherein the each light emitting device has a non-reflective layer disposed on a lateral side of the light emitting structure, and
    wherein the non-reflective layer comprises at least two layers having different refractive indices.

17. The display device as claimed in claim 16, wherein a distance between the substrate and the display panel is about 10 mm to 30 mm.

18. The display device as claimed in claim 16, further comprising an optical sheet unit between the light guide member and the display panel.

19. The display device as claimed in claim 18, wherein the optical sheet unit includes at least one of a diffusion sheet, a light collection sheet, and a brightness enhancement sheet.

20. The display device as claimed in claim 16, wherein the light guide member has a thickness of about 1 mm to 10 mm.

21. The display device as claimed in claim 16, wherein the at least one insertion cavity is formed on an inner wall thereof with a roughness structure.

22. The backlight unit as claimed in claim 1, wherein the non-reflective layer comprises a first refractive layer on a side portion of the active layer and a second refractive layer on the first refractive layer, and wherein a refractive index of the first refractive layer is higher than a refractive index of the second refractive layer.

23. The backlight unit as claimed in claim 11, wherein the non-reflective layer comprises a first refractive layer on a side portion of the active layer and a second refractive layer on the first refractive layer, and wherein a refractive index of the first refractive layer is higher than a refractive index of the second refractive layer.

* * * * *

UNITED STATES PATENT AND TRADEMARK OFFICE
CERTIFICATE OF CORRECTION

Page 1 of 1

PATENT NO. : 8,382,305 B2
APPLICATION NO. : 12/896409
DATED : February 26, 2013
INVENTOR(S) : Jeung Mo Kang et al.

It is certified that error appears in the above-identified patent and that said Letters Patent is hereby corrected as shown below:

ON THE TITLE PAGE:

At item (30), correct the Foreign Application Priority Data to read as follows:

--Jan 6, 2010   (KR) ............ 10-2010-0000777--.

Signed and Sealed this
Ninth Day of July, 2013

Teresa Stanek Rea
*Acting Director of the United States Patent and Trademark Office*